(12) United States Patent
Noh et al.

(10) Patent No.: US 10,116,332 B2
(45) Date of Patent: Oct. 30, 2018

(54) METHOD FOR CONFIGURING CIRCULAR BUFFER INCLUDING OUTER CODE PARITY AND APPARATUS THEREFOR

(71) Applicant: LG ELECTRONICS INC., Seoul (KR)

(72) Inventors: Kwangseok Noh, Seoul (KR); Dongkyu Kim, Seoul (KR); Myeongjin Kim, Seoul (KR); Sangrim Lee, Seoul (KR); Hojae Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/458,712

(22) Filed: Mar. 14, 2017

(65) Prior Publication Data

US 2018/0269899 A1    Sep. 20, 2018

(51) Int. Cl.
| | |
|---|---|
| *H03M 13/00* | (2006.01) |
| *H03M 13/11* | (2006.01) |
| *H03M 13/09* | (2006.01) |
| *H04L 1/00* | (2006.01) |
| *H04W 88/02* | (2009.01) |
| *H04L 29/08* | (2006.01) |

(52) U.S. Cl.
CPC ....... *H03M 13/1102* (2013.01); *H03M 13/09* (2013.01); *H04L 1/0061* (2013.01); *H04L 69/323* (2013.01); *H04W 88/02* (2013.01)

(58) Field of Classification Search
CPC . H03M 13/1102; H03M 13/09; H04L 1/0061; H04L 69/323; H04W 88/02
See application file for complete search history.

(56) References Cited

U.S. PATENT DOCUMENTS

| | | | |
|---|---|---|---|
| 2016/0173262 A1* | 6/2016 | Davydov | H04L 5/14 370/329 |
| 2017/0173262 A1* | 6/2017 | Veltz | A61M 5/1723 |
| 2017/0201344 A1* | 7/2017 | Lim | H04L 1/0009 |

* cited by examiner

*Primary Examiner* — Sam Rizk

(74) *Attorney, Agent, or Firm* — Lee Hong Degerman Kang Waimey

(57) ABSTRACT

A method and corresponding user equipment (UE) for configuring a circular buffer in a wireless communication system. The method includes: generating a code block including a payload, a first outer code parity, and a second outer code parity from an input signal based on an outer code in a higher layer; generating a codeword from the code block based on an inner code in a physical layer; and configuring a circular buffer including the codeword and one or more second outer code parities. The first outer code parity is generated based on a first portion of the payload, the one or more second outer code parities, to which an encoding is not applied in the physical layer, are generated based on a second portion of the payload, at least a part of the second portion is different from the first portion, the codeword includes the payload, the first outer code parity, and an inner code parity generated from at least part of the code block based on the inner code, and a number of the one or more second outer code parities in the circular buffer is determined according to a maximum size of the codeword or an amount of resources for transmission.

12 Claims, 17 Drawing Sheets

FIG. 7

$$H = \begin{bmatrix} P^{h^b_{00}} & P^{h^b_{01}} & P^{h^b_{02}} & \cdots & P^{h^b_{0nb}} \\ P^{h^b_{10}} & P^{h^b_{11}} & P^{h^b_{12}} & \cdots & P^{h^b_{1nb}} \\ \cdots & \cdots & \cdots & \cdots & \cdots \\ P^{h^b_{mb0}} & P^{h^b_{mb1}} & P^{h^b_{mb2}} & \cdots & P^{h^b_{mbnb}} \end{bmatrix} = P^{H_b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

METHOD FOR CONFIGURING CIRCULAR BUFFER INCLUDING OUTER CODE PARITY AND APPARATUS THEREFOR

BACKGROUND OF THE INVENTION

Field of the Invention

The present invention relates to a method for configuring a circular buffer in a wireless communication system and apparatus therefor, and more particularly, to a method for configuring a circular buffer including an outer code parity and apparatus therefor.

Discussion of the Related Art

Wireless communication systems have been widely deployed in order to provide various types of communication services including voice and data services. In general, a wireless communication system is a multiple access system that can support communication with multiple users by sharing available system resources (a bandwidth, transmission power, etc.). Examples of multiple access systems include code division multiple access (CDMA), frequency division multiple access (FDMA), time division multiple access (TDMA), orthogonal frequency division multiple access (OFDMA), single carrier frequency division multiple access (SC-FDMA), multi carrier frequency division multiple access (MC-FDMA), etc.

Broadcast systems as well as the aforementioned communication systems have necessarily used a channel code. As a general method for configuring a channel code, a transmitting end can encode an input symbol using an encoder and transmitted the encoded symbol. In addition, for example, a receiving end can receive the encoded symbol and decode the received symbol to restore the input symbol. In this case, the size of the input symbol and the size of the encoded symbol can be defined in different ways according to a communication system. For example, in a turbo code for data information used in a long term evolution (LTE) communication system of a $3^{rd}$ generation partnership project (3GPP), the size of the input symbol is a maximum of 6144 bits and the size of the encoded symbol is 18432 (6144*3) bites. Turbo coding in an LTE communication system may be referred to by the 3GPP technical standard 36.212.

However, the LTE turbo code has characteristics whereby enhancement in performance is slight when a signal to noise ratio (SNR) exceeds a predetermined range even if being increased due to a structure of the code. In this regard, a code with a low error rate as possible can be considered, but in this case, complexity is increased.

SUMMARY OF THE INVENTION

Accordingly, embodiments of the present invention are directed to a method for configuring a circular buffer including an outer code parity and apparatus therefor that substantially obviate one or more problems due to limitations and disadvantages of the related art.

An object of the present invention is to provide a method for configuring a circular buffer for efficient communication.

Another object of the present invention is to provide an error correction method with a low error rate and low complexity.

A further object of the present invention is to provide an apparatus for supporting the methods.

It will be appreciated by persons skilled in the art that the objects that could be achieved with the present invention are not limited to what has been particularly described hereinabove and the above and other objects that the present invention could achieve will be more clearly understood from the following detailed description.

To achieve these objects and other advantages and in accordance with the purpose of the invention, as embodied and broadly described herein, in an aspect of the present invention, a method for configuring a circular buffer by a user equipment (UE) in a wireless communication system may include: generating a code block including a payload, a first outer code parity, and a second outer code parity from an input signal based on an outer code in a higher layer; generating a codeword from the code block based on an inner code in a physical layer; and configuring the circular buffer including the codeword and the second outer code parity. In addition, the first outer code parity may be generated based on a first portion of the payload and the second outer code parity may be generated based on a second portion of the payload. At least a part of the second portion is different from the first portion. Moreover, the codeword may include the payload, the first outer code parity, and an inner code parity generated from at least part of the code block based on the inner code.

In another aspect of the present invention, a user equipment (UE) may include a transceiver configured to transmit and receive signals and a processor for controlling the transceiver. In this case, the processor may be configured to generate a code block including a payload, a first outer code parity, and a second outer code parity from an input signal based on an outer code in a higher layer; generate a codeword from the code block based on an inner code in a physical layer; and configure a circular buffer including the codeword and the second outer code parity. In addition, the first outer code parity may be generated based on a first portion of the payload and the second outer code parity may be generated based on a second portion of the payload. At least a part of the second portion is different from the first portion. Moreover, the codeword may include the payload, the first outer code parity, and an inner code parity generated from at least part of the code block based on the inner code.

The above-mentioned aspects of the present invention are merely a part of preferred embodiments of the present invention. Those skilled in the art will derive and understand various embodiments reflecting the technical features of the present invention from the following detailed description of the present invention.

Accordingly, the present invention provides the following effects and/or advantages.

First, it is possible to increase a decoding probability through retransmission by including a parity generated in a higher layer in a circular buffer.

Second, low complexity of decoding can be achieved using a parity generated in a higher layer.

It will be appreciated by persons skilled in the art that the effects that can be achieved through the present invention are not limited to what has been particularly described hereinabove and other advantages of the present invention will be more clearly understood from the following detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 7 illustrates an example of a structured parity check matrix;

FIG. 8 illustrates an example of a model matrix;

DETAILED DESCRIPTION OF THE INVENTION

The following technology may be used for various wireless access systems such as code division multiple access (CDMA), frequency division multiple access (FDMA), time division multiple access (TDMA), orthogonal frequency division multiple access (OFDMA), and single carrier frequency division multiple access (SC-FDMA). The CDMA may be implemented by radio technology such as universal terrestrial radio access (UTRA) or CDMA2000. The TDMA may be implemented by radio technology such as global system for mobile communications (GSM)/general packet radio service (GPRS)/enhanced data rates for GSM evolution (EDGE). The OFDMA may be implemented by radio technology such as IEEE 802.11 (Wi-Fi), IEEE 802.16 (WiMAX), IEEE 802.20, and evolved UTRA (E-UTRA). The UTRA is a part of the universal mobile telecommunications system (UMTS). A 3rd generation partnership project long term evolution (3GPP LTE) communication system is a part of an evolved UMTS (E-UMTS) that uses E-UTRA, and employs OFDMA on downlink while employing SC-FDMA on uplink. LTE-advanced (LTE-A) is an evolved version of the 3GPP LTE system.

For the sake of clarity, 3GPP LTE/LTE-A is mainly described, but the technical idea of the present invention is not limited thereto. Specific terms used for the embodiments of the present invention are provided to help the understanding of the present invention. These specific terms may be replaced with other terms within the scope and spirit of the present invention.

Figure 1:
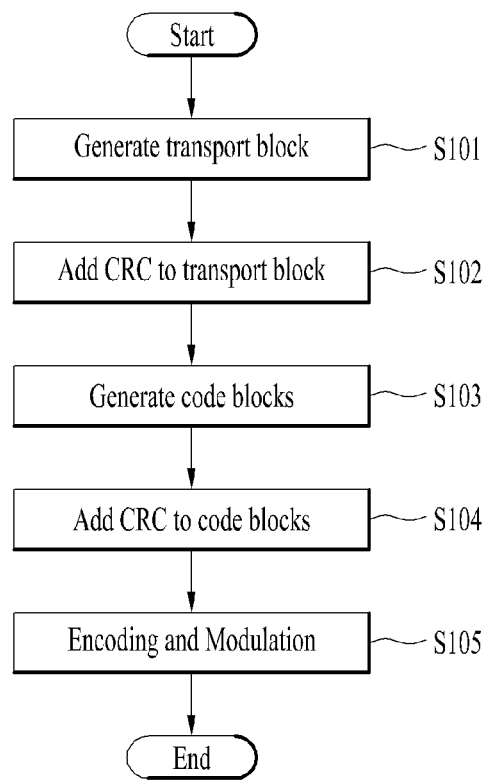
FIG. 1 illustrates a coding procedure according to an example.

FIG. 1 illustrates a coding procedure according to an example.

The coding procedure as shown in FIG. 1 may be applied to many channel codes including a turbo code used in the LTE communication system. Hereinafter, for simplicity, the coding procedure will be described based on terminology according to LTE communication system standards.

In the example of FIG. 1, the transmitting end may generate a transport block (TB) (S101). In addition, the transmitting end adds a CRC bit for the transport block to the transport block (S102). In addition, the transmitting end may generate code blocks from the transport block to which the CRC bit is added (S103). For example, the transmitting end may segment the transport block into code blocks based on the input size of the encoder. Further, the transmitting end may add a CRC bit for each divided code block (S104). In this case, for example, the code block and the code block CRC bits may be configured with a size of 6144 bits. The transmitting end may perform encoding and modulation (S105) on each block including code blocks and CRC bits. For example, turbo coding may be applied as described above.

The decoding procedure may be performed in the reverse order of the coding procedure of FIG. 1. For example, the receiving end may decode each code block using a decoder corresponding to each encoder, finally construct one transport block, and then check whether the transport block has passed the CRC.

For example, the size of the input symbols may be different from that of the transport block (TB) from the Media Access Control (MAC) layer. If the size of the transport block is larger than the maximum input symbol size of the turbo code, the transport block may be segmented into a plurality of code blocks (CB). According to the LTE communication system standard, the size of the code blocks may be equal to a result obtained by subtracting the CRC (Cyclic Redundancy Check) bits from 6144 bits. An input symbol of a turbo code may be defined as data including code blocks and CRC or data including a transport block (wherein the size of the transport block is less than, for example, 6144 bits) and CRC. The size of the CRC bits is very small (e.g., a maximum of 24 bits) compared to 6144 bits. Accordingly, in the following description, unless otherwise defined, a code block may refer to the code block itself or a CRC bit corresponding to the code block, and a transport block refers to the transport block itself or CRC bits corresponding to the transport block.

Figure 2:
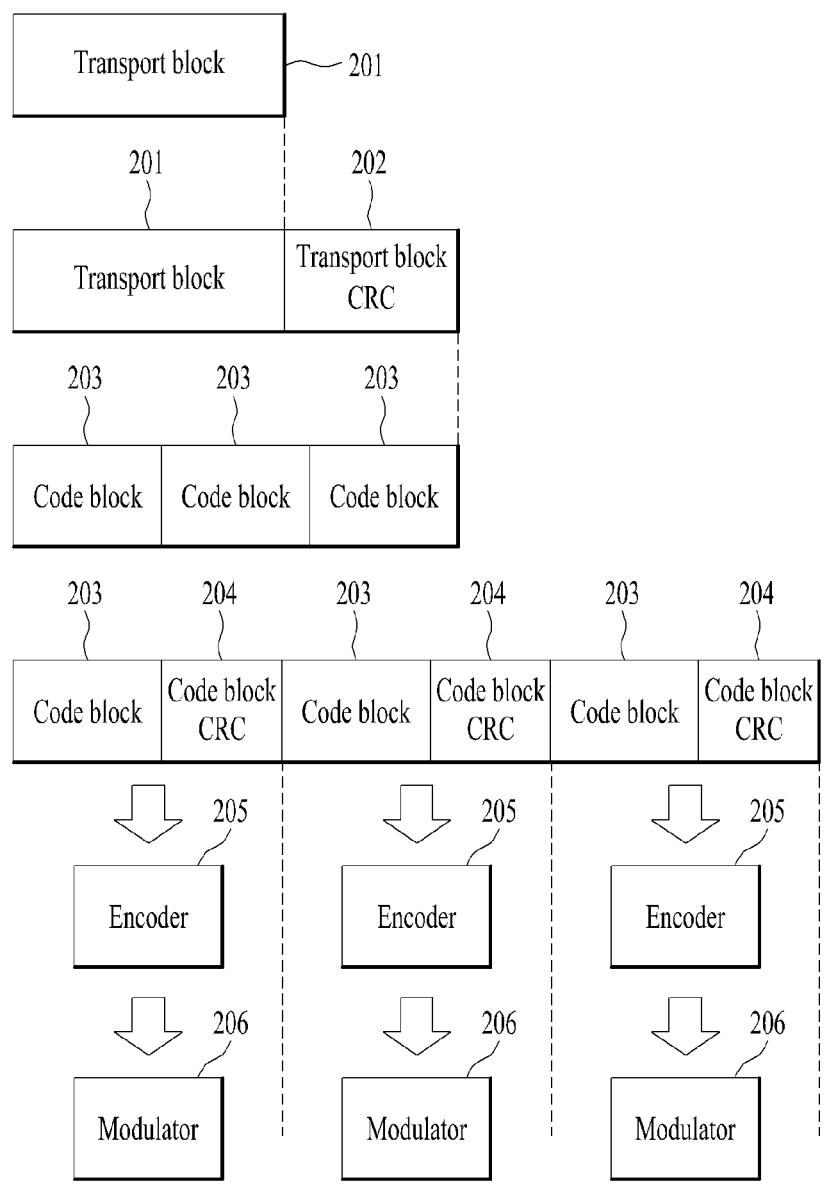
FIG. 2 illustrates a procedure of encoding a transport block according to an example.

FIG. 2 illustrates a procedure of encoding a transport block according to an example.

FIG. 2 illustrates a procedure of encoding a transport block 201 corresponding to the coding procedure described above with reference to FIG. 1. First, transport block CRC 202 is added to the transport block 201. The transport block CRC 202 may be used for identification of the transport block 201 in the decoding procedure. The transport block 201 and the transport block CRC 202 are then segmented into three code blocks 203. While the transport block 201 is segmented into three code blocks 203 in this embodiment, the transport block 201 may be segmented into a plurality of code blocks based on the input size of the encoder 205.

Code block CRC 204 is added to each of the code blocks 203. The code block CRC 204 may be used for identification of the code block 203 at the receiving end. The code blocks 203 and the code block CRC 204 may be coded via the encoder 205 and the modulator 206.

Figure 3:
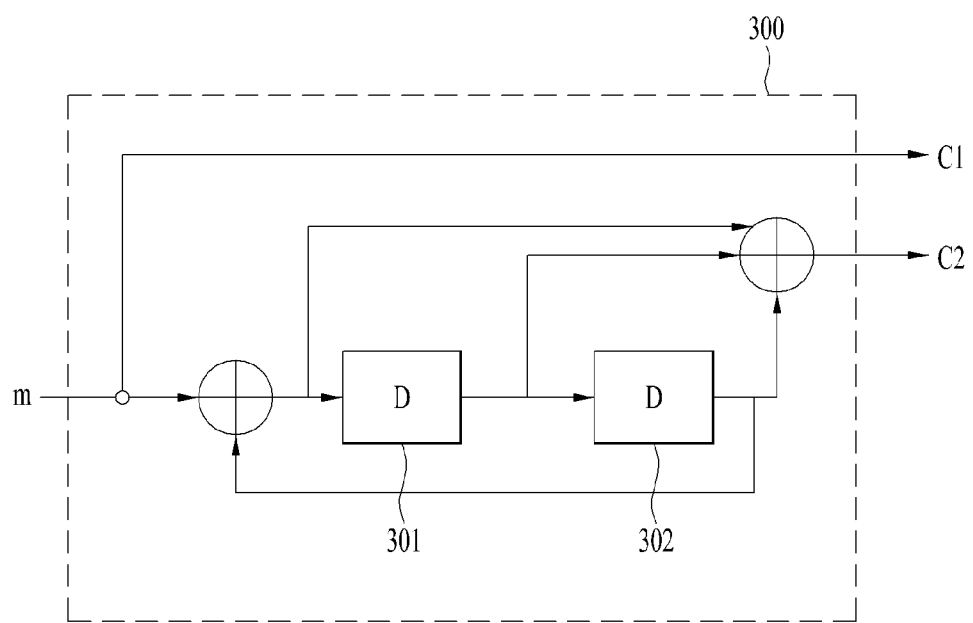
FIG. 3 illustrates a recursive systematic convolutional (RSC) encoder according to an example.

FIG. 3 illustrates a recursive systematic convolutional (RSC) encoder according to an example.

An RSC encoder 300 of FIG. 3 may be used for turbo coding. In FIG. 3, m denotes input data, C1 denotes a systematic bit string, and C2 denotes a coded bit string. Here, the RSC encoder 300 has a code rate of 1/2.

The RSC encoder 300 may be configured by feeding back a coded output to the input of a non-recursive non-systematic convolutional encoder. In the embodiment of FIG. 3, the encoder 300 includes two delay units 301, 302. The value D of the delay units 301 and 302 may be determined according to a coding scheme. The delay unit 301, 302 may include a memory or a shift register.

Figure 4:
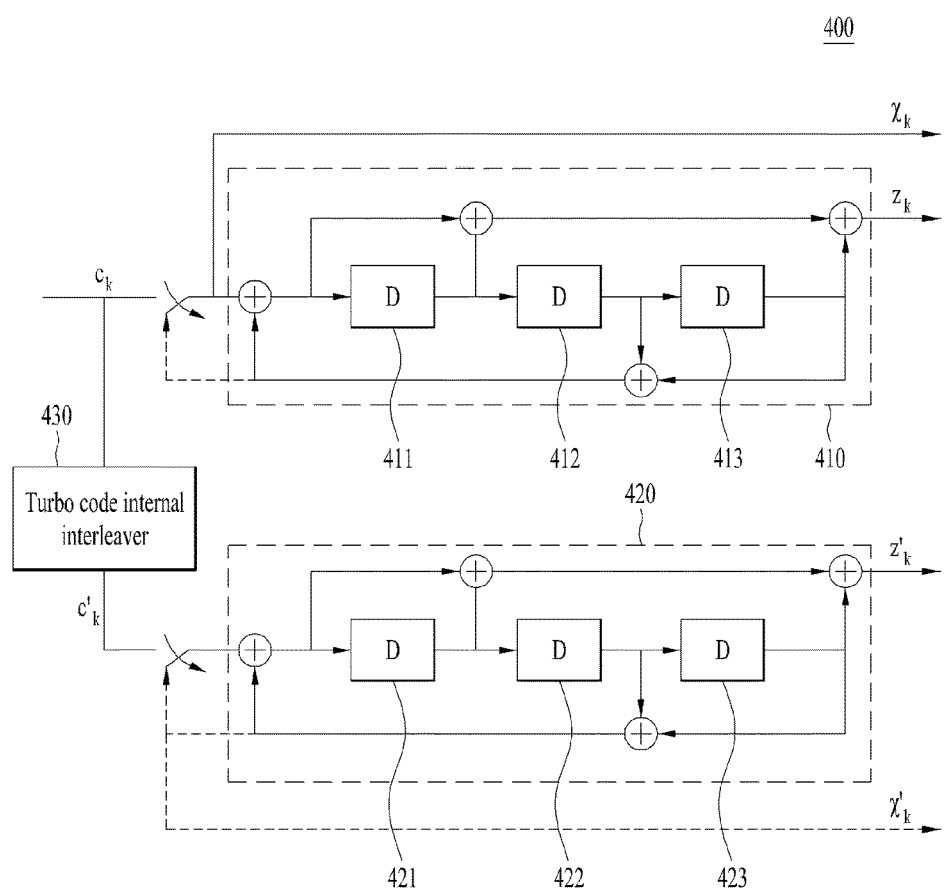
FIG. 4 illustrates a long term evolution (LTE) turbo encoder.

FIG. 4 illustrates an LTE turbo encoder.

The coding scheme of the LTE turbo encoder 400 is a parallel concatenated convolutional code (PCCC) having two 8-state constituent encoders 410 and 420 and a turbo code internal interleaver 430.

In FIG. 4, the turbo encoder 400 includes a first constituent encoder 410, a second element encoder 420, and a turbo code internal interleaver 430. The first constituent encoder 410 and the second constituent encoder 420 are 8-state constituent encoders. The first constituent encoder 410 and the second constituent encoder 420 are configured in a structure similar to that of the RSC encoder of FIG. 3. Each of the first constituent encoder 410 and the second constituent encoder 420 includes three delay units 411, 412 and 413, 421, 422 and 423.

In FIG. 4, D is a value determined according to a coding scheme and $c_k$ is an input to the turbo encoder 400. The outputs from the first constituent encoder 410 and the second constituent encoder 420 are denoted by $z_k$ and $z'_k$, respectively. The value output from the turbo code internal interleaver 430 is denoted by $c'_k$. Generally, the delay units 411, 412, 413, 421, 422, 423 may delay the input values by one clock. However, the delay units 411, 412, 413, 421, 422, 423 may be configured to delay the input values by more than one clock depending on the internal configuration thereof. The delay unit 411, 412, 413, 421, 422, 423 may include a shift register, delay an input bit by a predetermined clock, and then output the input bit to the next delay unit 411, 412, 413, 421, 422, 423.

The turbo code internal interleaver 430 may lower the influence of a burst error that may occur when a signal is transmitted over a radio channel. For example, the turbo code internal interleaver 430 may be a quadratic polynomial permutation (QPP) interleaver.

The turbo code is a high performance forward error correction (FEC) code and is used in the LTE communication system. For example, a data block coded by the turbo code may include three sub-blocks. One of the sub-blocks may correspond to m-bit payload data. Another subblock may be configured with n/2 bits, i.e., parity bits for the payload, calculated using a recursive systematic convolution (RSC) code. The other subblock may be configured with n/2 bits, i.e., parity bits for permutation of payload data, calculated using an RSC code. For example, the above-described permutation may be performed by an interleaver. Thus, two sub-blocks having different parity bits and the payload may constitute one block. For example, if m is equal to n/2, one block has a code rate of 1/3.

In the first constituent encoder 410, the procedure in which the input $c_k$ reaches the coded bit $z_k$ may be divided into two paths. The two paths are a first path connected from an input terminal to an output terminal without output feedback and a second path fed back from an input terminal to the input terminal.

In the first path, an input $c_k$ passed through the delay unit 411, and an input $c_k$ passed through the delay units 411, 412, and 413 are applied to the output terminal. The relationship between the input terminal and the output terminal for the first path may be expressed by a polynomial. The polynomial for the first path is called a forward generator polynomial and may be expressed as g1 in the following equation.

$$g1(D)=1+D+D^3 \quad \text{[Equation 1]}$$

In the second path, an input $c_k$, an input $c_k$ passed through the delay units 411 and 412, and an input $c_k$ passed through the delay units 411, 412 and 413 are fed back to the input terminal. The polynomial for the second path is called a recursive generator polynomial and may be expressed as g0 in the following equation.

$$g0(D)=1+D^2+D^3 \quad \text{[Equation 2]}$$

In [Equation 1] and [Equation 2], "+" means exclusive OR (XOR), and 1 means that the input undergoes 0 delay. In addition, $D^n$ means that the input undergoes n delays.

Figure 5:
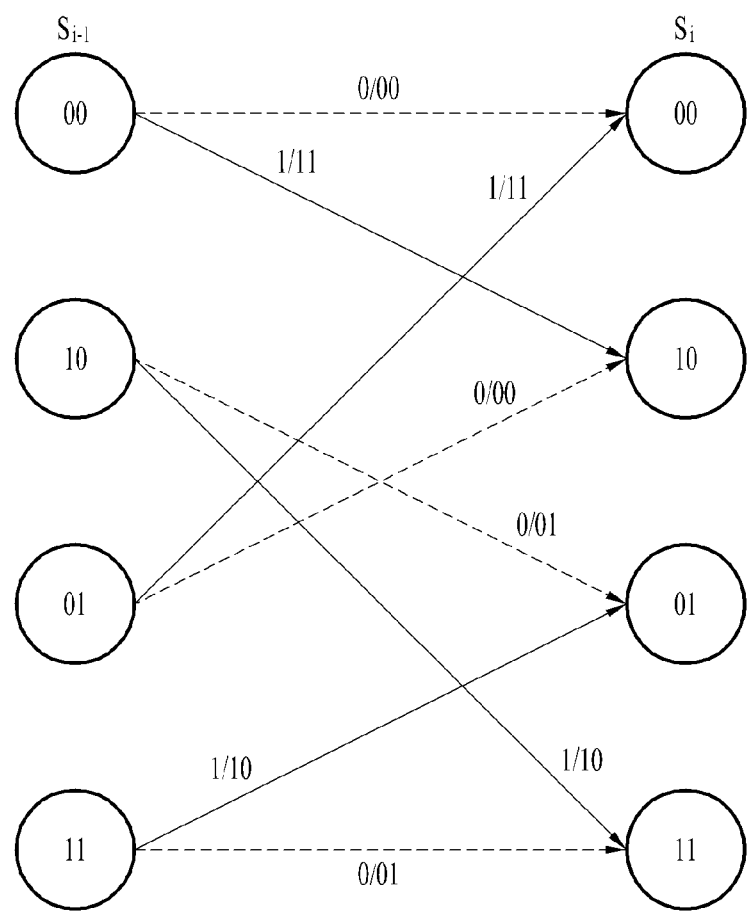
FIG. 5 illustrates an example of a trellis according to an RSC encoder.

FIG. 5 illustrates an example of a trellis according to an RSC encoder.

FIG. 5 shows the structure of the trellis of the RSC encoder shown in FIG. 3. In FIG. 5, S, denotes the state of the $i^{th}$ input data. In FIG. 5, each circle represents a corresponding node. In addition, a line connected between nodes represents a branch. The solid line represents a branch for the input value of 1, and the dotted line represents a branch for the input value of 0. The value on a branch is indicated by m/C1C2 (input value/systematic bit, coded bit). The trellis may also have a state that is exponentially proportional to the number of memories of the encoder. For example, if the number of memories included in the encoder is a, $2^a$ states may be included in the trellis.

The trellis is a state machine that shows a possible state transition of an encoder between two states. A convolutional encoder such as the RSC encoder may perform coding according to a trellis diagram. The codeword coded by the RSC encoder may be decoded according to an algorithm based on the trellis structure. For example, the Viterbi or BCJR (Bahl, Cocke, Jelinek and Raviv) algorithm may be used.

Figure 6:
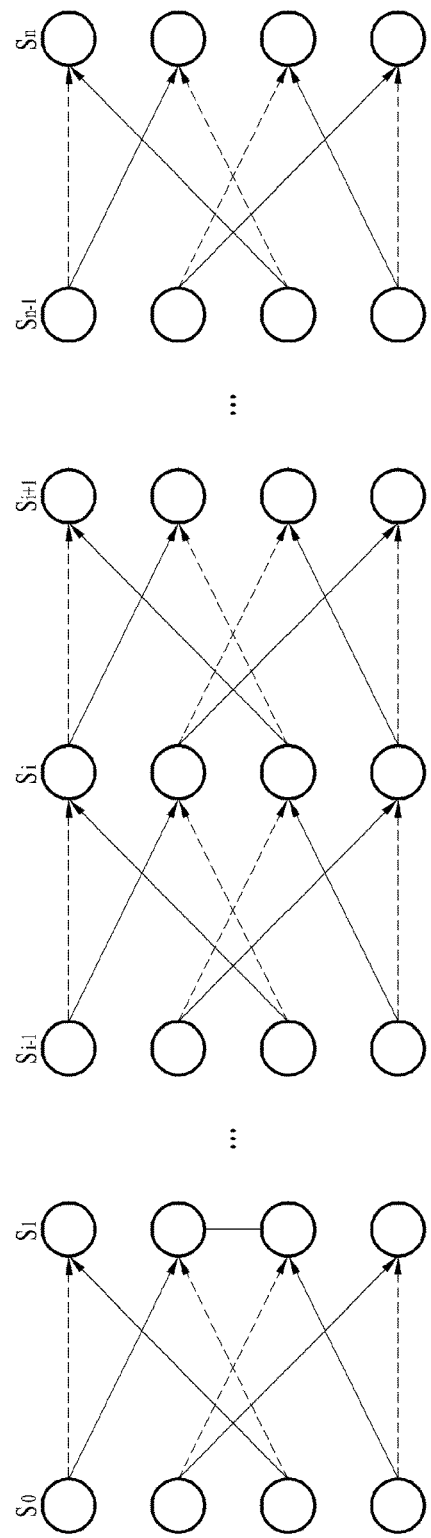
FIG. 6 illustrates an example of a trellis structure.

FIG. 6 illustrates an example of a trellis structure.

In FIG. 6, n denotes the length of a codeword. Typically, the trellis may be terminated by adding an additional bit after an input sequence. In general, a sequence configured as a sequence of 0 is referred to as a tail bit. The tail bit causes the nodes in one state of the trellis to have 0 as a value to terminate the trellis.

In FIG. 6, the length of the codeword may be determined in consideration of the length k of the input data and the length t of the tail bits. For example, if the code rate is R, the length n of the codeword may be (k+t)/R. In general, a length by which all delay units (e.g., memories) of the encoder may be reset may be determined as the length t of the tail bits. For example, the RSC encoder of FIG. 3 may use a total of 2 bits as the tail bits. The turbo encoder for LTE communication as shown in FIG. 4 may use 3 bits as the tail bits.

The length of the tail bits is shorter than the length of the input data. As described above, since the length of the codeword is associated with the length of the tail bits, loss of the code rate may occur due to the tail bits when the length of the codeword is limited. However, despite the loss of the code rate due to the tail bits, the trellis is terminated using the tail bits in many cases. This is because this method lowers computational complexity and exhibits excellent error correction performance.

The puncturing code refers to a method of puncturing a part of a codeword. In the puncturing code, a part of a codeword is punctured such that the part of the codeword is not transmitted. For example, the puncturing code may be used to lower the code rate loss caused by addition of tail bits. In this case, the receiving end may perform decoding using the trellis corresponding to the sum of the length k of the input data and the length t of the tail bits. That is, the receiving end may perform decoding on the assumption that the non-punctured codeword is received. In this case, the receiving end may consider that there is no input value for the branch from a node corresponding to the punctured bit (i.e., the bit not transmitted from the transmitting end). That is, for the branches of the node, the input data is assumed to be 0 or 1 with the same probability.

As described above with reference to FIG. 1, the CRC for a code block is added to the code block. The CRC may be determined as a remainder obtained by dividing data to be transmitted by a predetermined check value. In general, the CRC can be added to the end portion of transmitted data. The receiving end may compare the CRC with a remainder obtained by dividing received data by a predetermined check value. Alternatively, the receiving end may determine whether a remainder obtained by dividing total received data including the CRC by the check value is 0.

When a transport block size is 6144 bits, the CRC may have a maximum size of 24 bits. Thus, a code block size is determined based on the remaining bits except the CRC bits.

The receiving end may perform decoding on each code block. Thereafter, the receiving end configures a transport block based on the code block and then checks CRC for the transport block to determine whether the decoding is successfully performed. In the current LTE system, a code block CRC is used for early decoding termination. For example, if the receiving end fails to check CRC for a single code block, the receiving end may transmit NACK (Negative ACKnowledgement) to the transmitting end without decoding of remaining code blocks.

When receiving the NACK, the transmitting end may retransmit at least part of the transmitted data. For instance, the transmitting end may retransmit a transport block or at least one code block. For example, if the entirety of the transport block is retransmitted, a large amount of radio resources may be used for the retransmission. In addition, if the receiving end intends to transmit NACK due to a code block CRC failure, the receiving end may transmit information (e.g., an index of the code block) of the code block where the CRC failure occurs to the transmitting end together. Moreover, the transmitting end may retransmit the code block where the CRC failure occurs using the code block information in order to improve radio resource efficiency. However, as the number of code blocks increases, the amount of data required for feeding back information of the code blocks (e.g., code block indices) also increases.

In the LTE communication system, the receiving end uses ACK/NACK signals to inform the transmitting end whether the receiving end receives data successfully. In frequency division duplex (FDD), ACK/NACK for data received in an $i^{th}$ subframe is transmitted in an $(i+4)^{th}$ subframe. If the NACK is transmitted in the $(i+4)^{th}$ subframe, retransmission may be performed on an $(i+8)^{th}$ subframe. This is the result obtained by considering a time required for processing the transport block and a time required for generating the ACK/NACK. Specifically, a process in which a channel code for the transport block is fairly time consuming. In time division duplex (TDD), the ACK/NACK and a subframe for the retransmission may be determined based on the time required for processing the transport block, the time required for generating the ACK/NACK, and uplink subframe allocation (e.g., TDD uplink/downlink configuration). In addition, ACK/NACK bundling and multiplexing can also be used.

As described above, in the case of the turbo code, if an SNR exceeds a predetermined range, its error correction rate cannot be improved significantly. In this regard, a low-density parity-check (LDPC) code has been proposed as an alternative of the turbo code. The LDPC code, which corresponds to a linear block code, has been used in IEEE 802.11n, 802.11ac, and digital video broadcasting (DVB). The LDPC code may include a generation matrix and a parity check matrix. Data in the LDPC code may be encoded by a product of message bits and the generation matrix. In the communication standards using the LDPC code, the generation matrix may be replaced with the parity check matrix. For example, data encoding can be performed using the parity check matrix.

A linear block code can be generated based on a generation matrix G and a parity check matrix H. The linear block code is configured such that it satisfies the condition of $Hc^t=0$ with respect to every codewords c. Similar to other linear block codes, the LDPC code can be decoded by checking whether a value obtained by multiplying the parity check matrix H and the codeword c is 0. In other words, if a product (i.e., $Hc^t$ of a transposed matrix of the codeword c and the parity check matrix H is 0, it may be determined that the LDPC code is decoded.

In the case of the LDPC code, most elements of the parity check matrix are set to 0 and the number of elements that are not 0 is smaller than a code length. Thus, the LDPC code can be repeatedly decoded on the basis of probability. According to the initially proposed LDPC code, the parity check matrix is defined to have a non-systematic form and a small weight is equally applied to a row and a column of the parity check matrix. Here, the weight may mean the number of is included in a row or column.

As described above, the number of non-zero elements in the parity check matrix H of the LDPC code is relatively small. Thus, the LDPC code has low decoding complexity and shows performance close to Shannon's theoretical limit. Due to high error correction performance and low decoding complexity, the LDPC code is considered to be suitable for high-speed wireless communication.

Hereinafter, a structured LDPC code will be described.

Figures 7, 8:
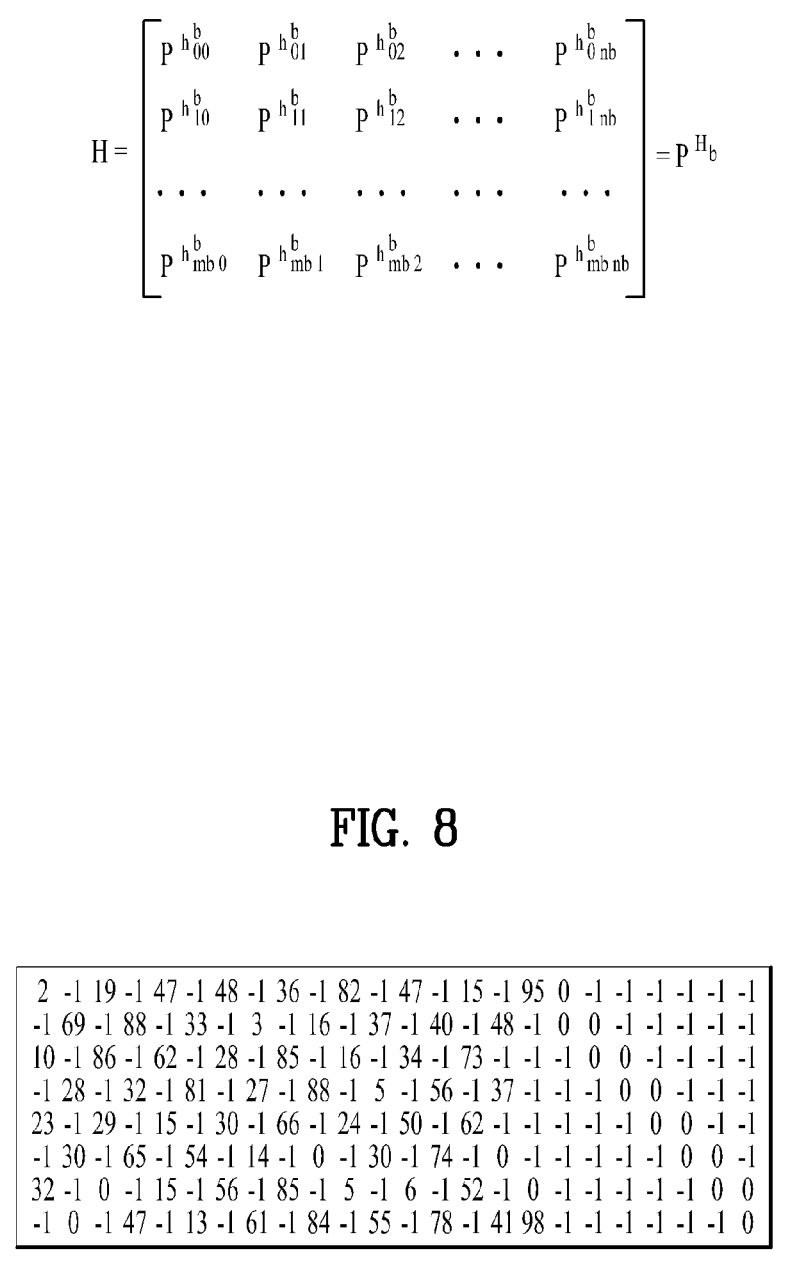

The parity check matrix H can be used to generate the LDPC code as described above. The matrix H is composed of many 0 elements and some 1 elements. The size of the matrix H may be greater than $10^5$ bits and thus, a large memory may be required to represent the matrix H. According to the structure LDPC code, elements of the matrix H can be represented as a fixed size of sub-blocks as shown in FIG. 7. In FIG. 7, each element of the matrix H denotes a single sub-block.

According to IEEE 802.16e standard, the size of the memory for representing the matrix H can be reduced by representing the sub-block as a single integer index. In this case, each sub-block may be, for example, a permutation matrix having a fixed size.

FIG. 8 illustrates an example of a model matrix.

Specifically, FIG. 8 shows when a codeword size is 2304 and a code rate is 2/3, the model matrix used for encoding/decoding the LDPC code, which is defined in IEEE 802.16e standard. In the following description, the model matrix may mean a parity check matrix composed of at least one sub-block and each sub-block may mean a shift number. In addition, the model matrix can be extended to the parity check matrix according to a method proposed in the present invention. Therefore, encoding and decoding based on a specific model matrix may imply encoding and decoding based on the parity check matrix generated by extending the corresponding model matrix.

In FIG. 8, index '−1' indicates a predetermined size of zero matrix and index '0' indicates a predetermined size of identity matrix. In addition, positive integer indices except the indices '−1' and '0' indicate shift numbers. For example, a sub-block expressed as index '1' may mean a matrix obtained by shifting the identity matrix once in a specific direction.

Figures 9, 10:
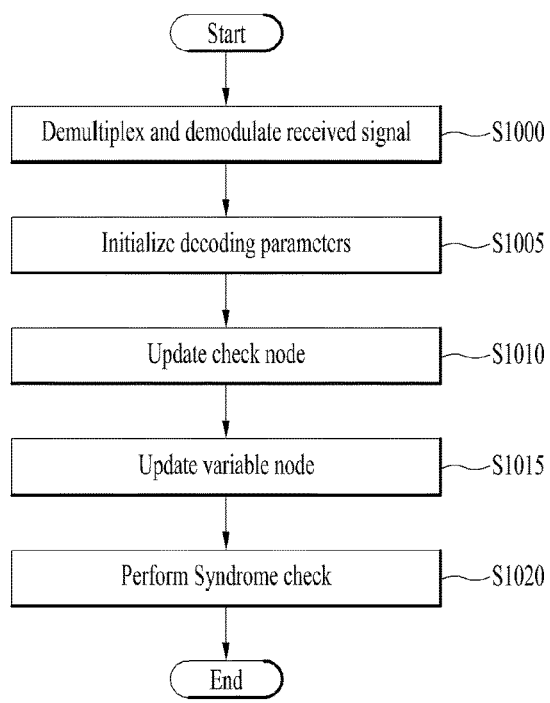
FIG. 9 is a diagram for explaining conversion of a matrix according to a shift number.
FIG. 10 is a flowchart illustrating an example of a method for decoding an LDPC code.

FIG. 9 is a diagram for explaining conversion of a matrix according to a shift number.

Specifically, FIG. 9 shows a case in which a sub-block has a size of 4 by 4. Referring to FIG. 9, the sub-block is shifted by three times to the right from with reference to the identity matrix. In this case, the sub-block of the parity check matrix of the structured LDPC code can be expressed using integer index '3'.

In general, to perform LDPC code encoding, the generation matrix G is generated from the parity check matrix H and information bits are encoded using the generation matrix G. To this end, Gaussian Reduction is performed on the parity check matrix H and then a matrix in the form of [$P^T$:I] is generated. If the number of information bits is k and a codeword size is n, a matrix P may have k rows and (n-k) columns and a matrix I may be an identity matrix with a size of k.

If the parity check matrix has the form of [$P^T$:I], the generation matrix G may have the form of [I:$P^T$]. In addition, if k-bits of information is encoded, the encoded information bits may be expressed as a matrix x with a size of 1 by k. In this case, the codeword c is represented as xG and the xG has the form of [x:xP], where x corresponds to an information part (or systematic part) and xP corresponds to a parity part.

Alternatively, by designing the matrix H to have a specific structure instead of using Gaussian Reduction, the information bits can be directly encoded from the matrix H without generating the matrix G. From the structures of the matrices H and G, it can be seen that a product of the matrix G and a transposed matrix of the matrix H is 0. Based on such features and a relationship between the information bits and codeword, parity bits can be added to the end of the information bits, thereby obtaining the codeword.

FIG. 10 is a flowchart illustrating an example of a method for decoding an LDPC code.

In the communication system, while encoded data is transmitted over a radio channel, noise is included in the data. Considering this fact, the codeword c can be expressed as a codeword c' from the perspective of the receiving end. The receiving end performs demultiplexing and demodulation with respect to a received signal [S1000] and then initializes decoding parameters [S1005]. Subsequently, the receiving end updates a check node and a variable node [S1010 and S1015] and then performs a syndrome check [S1020]. That is, the receiving end can terminate a decoding procedure is terminated after checking whether c'$H^T$ is 0 or not. If the c'$H^T$ is 0, first k bits of the codeword c' can be determined as information bits x. Otherwise, if the c'$H^T$ is not 0, information bits x can be restored by finding a codeword c' that satisfies the condition of c'$H^T$=0 based on a decoding scheme such as a sum-product.

Figure 11:
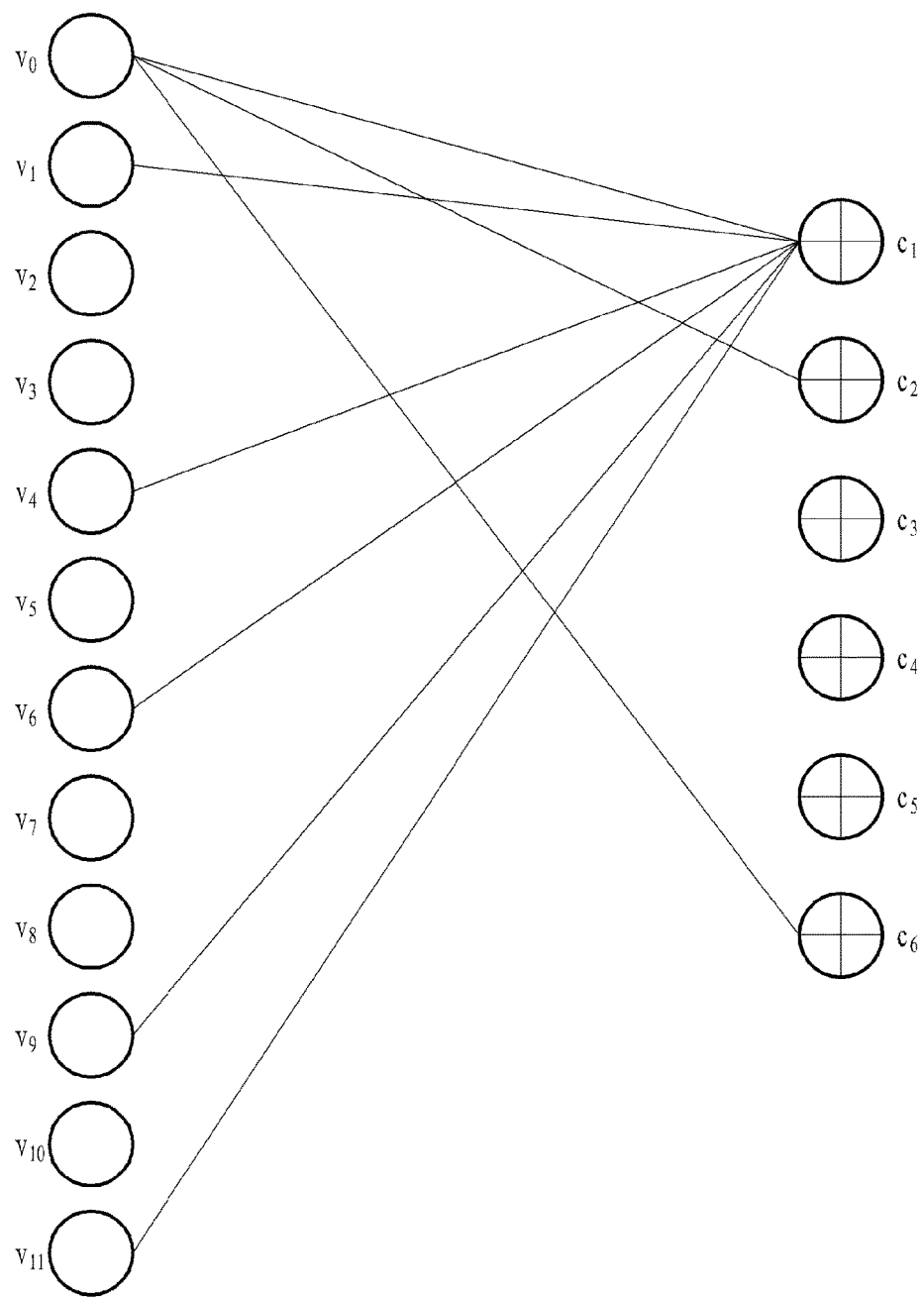
FIG. 11 illustrates an example of a bipartite graph.

FIG. 11 illustrates an example of a bipartite graph

In FIG. 11, nodes ($v_0, v_1, \ldots, v_{11}$) in the left side indicate variable nodes and nodes ($c_1, c_2, \ldots, c_6$) in the right side indicate check nodes. For convenience of description, FIG. 11 shows nodes connected to a variable node $v_0$ and a check node $c_1$. A connection line shown in the bipartite graphs of FIG. 11 can be referred to an edge. In addition, the bipartite graph of FIG. 11 may be generated from the Hc'. Thus, in FIG. 11, edges from the variable node $v_0$ may correspond to the first column of the parity check matrix H and edges from the check node $c_1$ may correspond to the first row of the matrix H.

Since the product of the parity check matrix H and the transposed matrix of the codeword c should be 0 for successful decoding as described above, values of variable nodes connected to a single check node should also be 0. Thus, in the case of FIG. 11, the exclusive OR (XOR) of variable nodes ($v_0, v_1, v_4, v_6, v_9$, and $v_{11}$) connected to the check node $c_1$ should be 0. That is, the syndrome check means to check whether the XOR of variable nodes connected to each check node is 0.

Figure 12A:
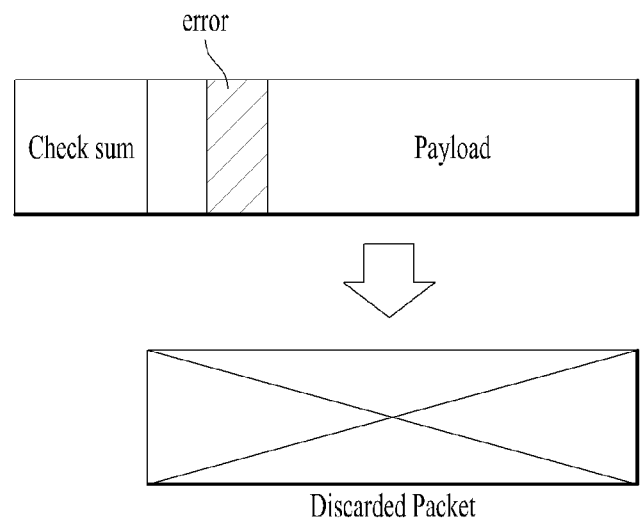
FIG. 12a illustrates error data processing based on a UDP protocol.
Figure 12B:
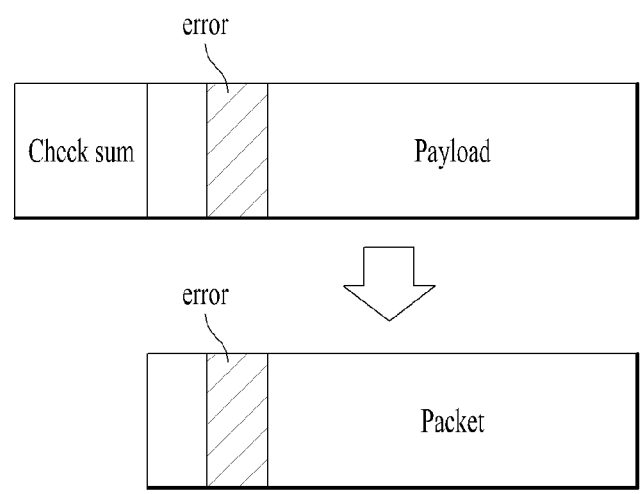
FIG. 12b illustrates error data processing based on a UDP-Lite protocol.

FIG. 12a illustrates error data processing based on a UDP protocol and FIG. 12b illustrates error data processing based on a UDP-Lite protocol.

The UDP-Lite (Lightweight User Datagram Protocol) has taken into consideration as a method for reducing an end-to-end delay between the transmitting and receiving ends to achieve a high transfer rate.

According to the conventional UDP protocol shown in FIG. 12a, when an error is present in a payload, the corresponding payload is discarded. However, in a system using the UDP-Lite, even though there are errors in some symbols of a payload, the payload can be transmitted to a higher layer of a physical layer using a partial checksum as shown in FIG. 12b.

For instance, in case of multimedia data, if a checksum error occurs, the system using the UDP discards a corresponding packet. This is because if the multimedia data is video data, it may cause screen suspension. However, in the system using the UDP-Lite, the payload in which some errors are included is transmitted and it may cause an acceptable error (e.g., a noise screen). In other words, when there is an error in a payload, using a packet containing the error may be more advantageous than discarding the entirety of the corresponding payload. Hence, the UDP-Lite is more suitable for such a multimedia data transmission system.

Meanwhile, a rapid-tornado (raptor) code, which is a type of LDPC code, is used for application layer-forward error correction (AL-FEC) in multimedia broadcast multicast services (MBMS) of the 3GPP. The raptor code means a fountain code where linear time encoding and decoding can be applied. According to the raptor code, a message consisting of k symbols can be encoded into a potentially limitless sequence of encoding symbols. As any k or more symbols are received, a probability of recovering the message approaches 1.

The raptor codes are formed by a concatenation of two codes. In this case, a fixed rate erasure code is applied as a 'pre-code' or 'outer code'. The outer code may also be formed by a concatenation of multiple codes. For example, according to the 3GPP, a high density parity check code may be derived from the binary Gray sequence, which is concatenated with a simple regular low density parity check code. For another example, the outer code may be formed by a concatenation of the Hamming code with a low density parity check code.

An inner code may have a form of Luby transform (LT) codes. Each encoding symbol may be generated by performing the XOR operation on a set of symbols pseudo-randomly selected from an outputted outer code.

The raptor code can be decoded according to two approaches. In a concatenated approach, the inner code is first decoded using a belief propagation algorithm. If a sufficient number of symbols is recovered such that the outer code can recover the remaining symbols, decoding can be considered to be successful. In a combined approach, relationships between symbols defined by both of the inner and outer codes are taken into consideration.

According to the AL-FEC, a packet processed by the UDP protocol (i.e., the packet that has passed through the erasure channel) is used as an input for a decoder. Decoding in the erasure channel can be performed according to two schemes: a maximum likelihood (ML) scheme and a message passing (MP) scheme. Hereinafter, MP decoding applicable to the embodiments of the present invention will be described with reference to FIG. 13.

Figure 13:
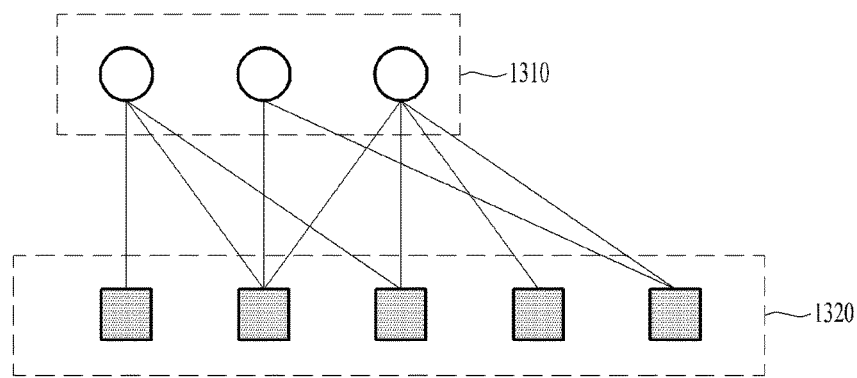
FIG. 13 illustrates a bipartite graph for MP decoding.

FIG. 13 illustrates a bipartite graph for MP decoding.

Specifically, FIG. 13 shows edges between packets 1310 to be restored and packet 1320s received from a transport layer. The number of edges of each received packet may be called a degree. In the case of the MP decoding, decoding starts from a received packet with a degree of 1. The decoding procedure is repeated until when all packets are restored or there is no node with a degree of 1.

A coding scheme based on the erasure channel can be used in a higher layer and in this case, the decoding may be performed based on either a value that the receiving end can obtain or a value that the receiving end cannot know. The former value may imply a value that can be determined as a specific value with more than a certain probability or a predetermined value (e.g., a predetermined parity check matrix) for the receiving end. In addition, the latter value may imply a received codeword or a value determined with less than a predetermined probability (e.g., log-likelihood). In this case, simple XOR operation may be used by the higher layer for the decoding. Therefore, the decoding in the higher layer can be performed with low complexity, compared to channel coding in a physical layer.

Figure 14:
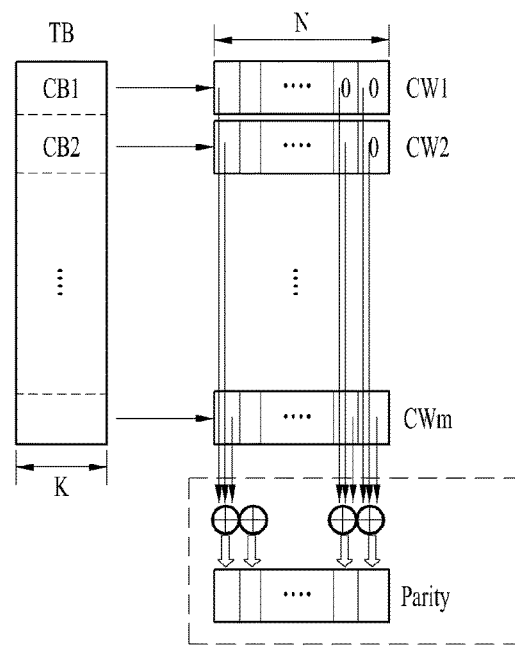
FIG. 14 illustrates an example of encoding using a single parity.

FIG. 14 illustrates an example of encoding using a single parity.

The example of FIG. 14 shows that a transport block is divided into m code blocks (CB1, CB2, . . . , CBm) where m is a positive integer. In addition, each of the code blocks may have a length of K and codewords (CW1, CW2, . . . , CWm) are generated by encoding each of the code blocks according to a corresponding code rate. Moreover, according to the example shown in FIG. 15, zero-bit padding may be added such that each of the codewords (CW1, CW2, . . . , CWm) has a length of N. For example, 2-bit of zero-bit padding may be added to the CW1 in the example of FIG. 15. The zero-bit padding is performed such that all codewords have the same length N where N may be determined based on the longest codeword length or be predetermined.

For all the codewords (CW1, CW2, . . . , CWm) with the same length N, a single parity can be generated. For instance, one parity bit may be created by performing the XOR operation on bits of the individual codewords, which are located at the same position. Specifically, the first bit of the parity may be generated by performing the XOR (i.e., bit-wise XOR) operation on first bits of all the codewords (CW1, CW2, . . . , CWm).

As mentioned in the foregoing description, the zero-bit padding can be added to each codeword to generate the parity. However, when a codeword is actually transmitted, the zero-bit padding is not transmitted, that is, only the codeword is transmitted. In addition, the transmitting end may inform the receiving end of the parity length N. Alternatively, the receiving end may determine the parity length N based on received codewords.

Figure 15:
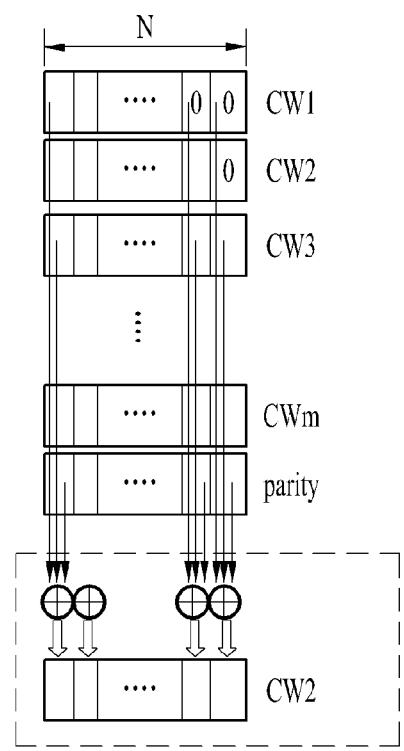
FIG. 15 illustrates an example of decoding using a single parity.

FIG. 15 illustrates an example of decoding using a single parity.

Referring back to FIG. 14, the parity can be transmitted together with the codewords to the receiving end. In the example of FIG. 15, assume that a CRC error occurs in CW2. In spite of the CRC error, the receiving end can attempt to perform codeword error correction based on the parity. For instance, as shown in FIG. 15, the receiving end can restore each bit of the CW2 by performing the XOR operation of each parity bit and the codewords except the CW2.

Hereinafter, a description will be given of a rate-matching method for the aforementioned code (e.g., LDPC code) where the outer and inner codes are combined. For instance, encoding may be performed by the higher layer using the outer code and encoding may be performed by the physical layer using the inner code. An output signal for the higher layer may be used as an input signal for the physical layer. For convenience of description, it is assumed that the LDPC code is used as a channel code for the physical layer. However, the following embodiments of the present invention is not limited thereto and the embodiments can be applied to all types of codes using the parity as the outer code.

Figure 16:
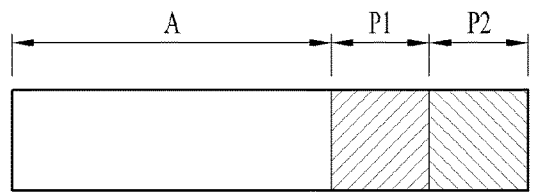
FIG. 16 illustrates a parity configuration of an outer code according to an embodiment.

FIG. 16 illustrates a parity configuration of an outer code according to an embodiment.

Referring to FIG. 16, A denotes a payload, P1 denotes a first parity, and P2 denotes a second parity. The first parity P1 and the second parity P2 may be generated using different combinations and/or portions. In addition, the first parity P1 and the second parity P2 may have different sizes. For example, the first parity may be created based on a first portion of the payload and the second parity may be created based on a second portion of the payload. The first and second portions may have different sizes and they may partially overlap with each other. Alternatively, the first and second portions may be configured not to overlap with each other. Although FIG. 16 shows that two parities (the P1 and the P2) are used, only a single parity (either the P1 or the P2) may be included in the outer code.

Hereinafter, a description will be given of a method of configuring a code block and codeword at a physical layer by using an output from an outer code. For example, in the physical layer, the code block from the outer code may be encoded into the codeword based on an inner code.

Figure 17A:
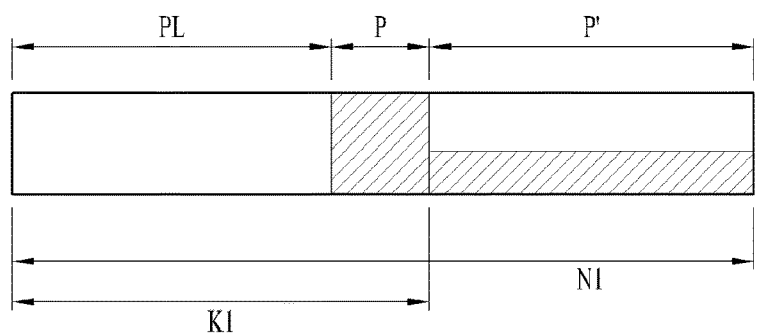
FIGS. 17a and 17b illustrate configurations of code blocks and codewords according to an embodiment.
Figure 17B:
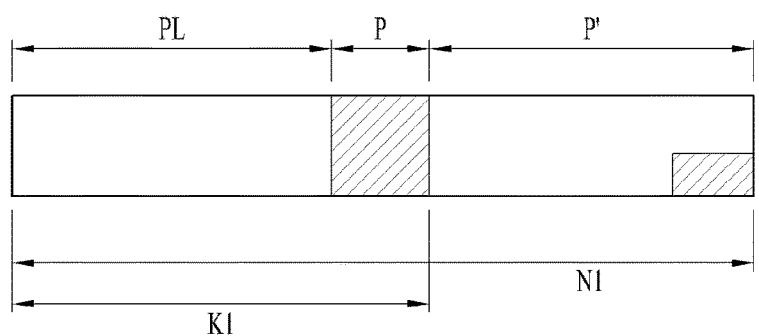

FIGS. 17a and 17b illustrate configurations of code blocks and codewords according to an embodiment.

Specifically, FIGS. 17a and 17b illustrate configurations of a code block K1 and a codeword N1 in the physical layer. Referring to FIGS. 17a and 17b, the code block K1 may be composed of a payload PL and a parity P. For example, the code block K1 may include the payload A of FIG. 16 and a parity (e.g., the first parity P1 or the second parity P2 in FIG. 16). In this case, the K1 may mean a code block size. That is, according to the present embodiment, the single code block K1 may include the single payload PL and the single parity P for at least one portion of the payload PL. In addition, N1 denotes a codeword in the physical layer. Thus, the codeword N1 may include the single code block K1 and another parity P'. Here, the parity P means a parity of the outer code (i.e., parity for the higher layer) and the parity P' means a parity of the inner code (i.e., parity for the inner layer). In FIGS. 17a and 17b, the parity P' may be generated based on at least one portion of the code block K1.

In FIG. 17a, since the parity P' is generated based on the code block K1, the parity P' may be generated based on the payload PL and the parity P. In addition, the bottom portion of the parity P', which is represented by a broken-line, means that the parity P' is generated based on not only the payload PL and the parity P.

In FIG. 17b, the parity P' is composed of a parity of the payload PL and a parity of the code block K1. The bottom portion of the parity P', which is represented by the broken line, indicates a parity generated based on the parity P and parts of the payload PL. In addition, the remaining portion (i.e., an empty portion) of the parity P' indicates a parity generated based on only the payload. In FIG. 17a, since the entirety of the parity P' is generated based on the parity P and the payload PL, the parity P' does not include a systematic part. On the other hand, the systematic part may be included in the parity P' in FIG. 17b. In the case of the outer code, the systematic part may be used to decode a single symbol in the code block K1. Therefore, a systematic parity shown in FIG. 17b can be used to improve a restoration possibility with respect to such significant bits as unequal error protection having different restoration capabilities in each bit in the physical layer.

Although in the embodiment of FIGS. 17a and 17b, only one of the two parities illustrated in FIG. 16 is used, both of the two parities can be used in the following embodiments.

Figure 18:
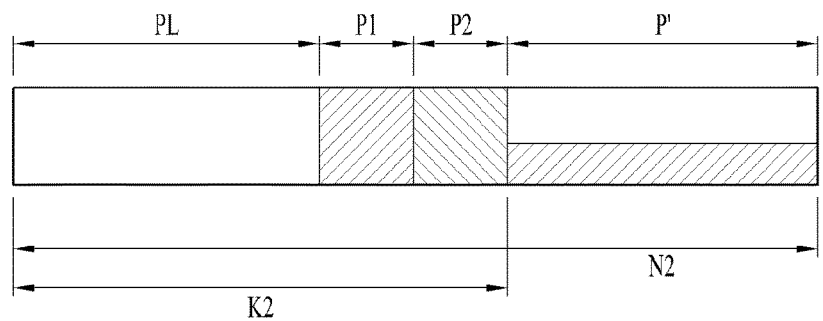
FIG. 18 illustrates a configuration of a code block and codeword according to another embodiment.

FIG. 18 illustrates a configuration of a code block and codeword according to another embodiment.

In the embodiment of FIG. 18, a code block K2 may include a payload PL, a first parity P1, and a second parity P2. The first parity P1 and the second parity P2 may correspond to the parity of the outer code. For example, the code block K2 may include the payload A of FIG. 16 and parities (e.g., the first parity P1 and the second parity P2 of FIG. 16). According to the present embodiment, a parity P' for the code block K2 may be generated based on the payload PL and the first parity P1. For example, the parity P' of the inner code may be created based on the payload PL and the second parity P2. In other words, in the present embodiment, the parity P' may be generated based on the payload PL of the code block K2 and one outer code parity (either the P1 or the P2).

Figure 19:
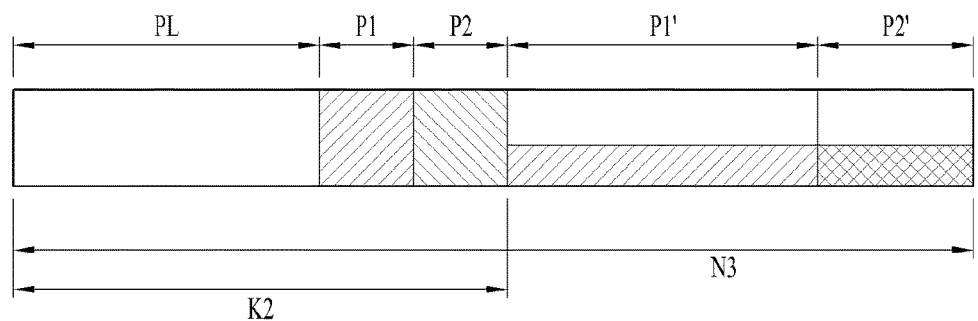
FIG. 19 illustrates a configuration of a code block and codeword according to a further embodiment.

FIG. 19 illustrates a configuration of a code block and codeword according to a further embodiment.

In the embodiment of FIG. 19, a code block K2 may include a payload PL, a first parity P1, and a second parity P2. The first parity P1 and the second parity P2 may correspond to the parity of the outer code. For example, the code block K2 may include the payload A of FIG. 16 and parities (e.g., the first parity P1 and the second parity P2 of FIG. 16). Parities P1' and P2' correspond to the parity of the inner code. According to the present embodiment, the parity P1' may be generated based on the payload PL and one outer code parity (either P1 or the P2) and the parity P2' may be generated based on the payload PL and the two outer code parities (the P1 and the P2).

Rate-matching can be performed to exactly extract bits that will be transmitted within a predetermined transmit time interval (TTI). For instance, the rate-matching may be performed on each code block. In general, the rate-matching may be performed in three steps: sub-block interleaving, bit collection, and bit selection. After completion of the rate-matching, individual code blocks are concatenated and then transferred to a modulation block (e.g., mapper). In the case of the turbo code, the sub-block interleaver may be defined for each output stream. The streams may include a systematic bit stream, a parity bit stream, and an interleaved parity stream. In the bit collection step, consecutive bits are extracted from a circular buffer to the extent suitable for allocated physical resources. In this case, the circular buffer can puncture or repeat collected coded bits to obtain a required channel coding rate.

As described above, the circular buffer allows the rate-matching through puncturing and repetition. In the case of the LTE turbo code, the circular buffer is firstly filled with systematic bits, followed by parity bits. For example, four redundancy versions may be defined for the circular buffer of the LTE communication system. In the circular buffer, decoding of the coded bits corresponding to the code rate starts from a specified starting point. The specified starting point may be determined according to a redundancy version. If the amount of bits required for the rate-matching is less than that in the circular buffer, some bits in the circular buffer may be punctured. On the other hand, if the amount of bits required for the rate-matching is greater than that in the circular buffer, bits may be repeated from the starting point of the circular buffer.

HARQ (hybrid automatic repeat request) is an error correction mechanism used in the LTE system. The received end receives a transmitted packet after a certain delay and then transmits ACK or NACK to the transmitting end. When the NACK is transmitted, the request packet is retransmitted. After receiving the NACK, the transmitting end may transmit bits decoded based on the redundancy version in each transmission. For example, redundancy version 0 may indicate the starting point of the circular buffer and redundancy versions 1, 2, and 3 may indicate locations of the circular buffer after the redundancy version 0. During the retransmission, the redundancy version gradually increases. Thus, as the retransmission procedure proceeds, the amount of systematic bits decreases and the amount of parity bits increases.

As mentioned above with reference to FIGS. 17a to 19, a codeword configuration can be changed. In this case, a circular buffer configuration can also be changed for the rate-matching and the like. Hereinafter, the circular buffer configuration will be described with reference to FIGS. 20 to 22.

Figure 20:
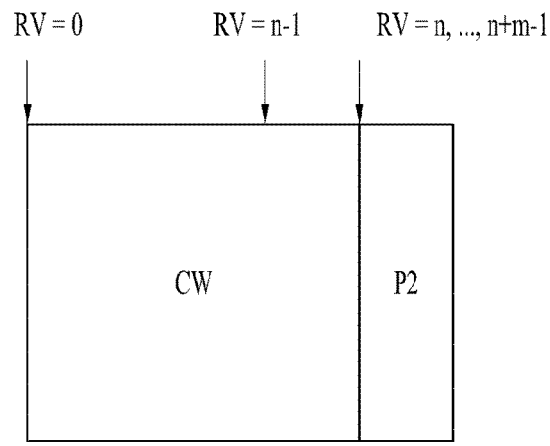
FIG. 20 illustrates a configuration of a circular buffer according to an embodiment.

FIG. 20 illustrates a configuration of a circular buffer according to an embodiment.

Specifically, FIG. 20 shows a circular buffer configuration corresponding to the codeword configuration shown in FIG. 17a or 17b. In the embodiment of the FIG. 20, the outer code parity P of FIGS. 17a and 17b may correspond to the first parity P1 of FIG. 16. In FIG. 20, a codeword (CW) in the circular buffer indicates a codeword in the physical layer and a parity P2 may correspond to the second parity P2 of FIG. 16. In addition, an RV indicates a redundancy version.

In the embodiment of FIGS. 17a and 17b, the physical layer uses only one outer code parity. However, according to the circular buffer configuration, the remaining one outer code parity, which is not used by the physical layer, can be included. For example, an encoding step is not applied by the physical layer to the parity P2 corresponding to the outer code parity. A rate starting point of the parity P2 may be determined in the range of redundancy versions n to (n+M−1). Thus, the parity P2 can be repeatedly transmitted up to m times during retransmission. In the embodiment of FIG. 20, the number of total columns of the circular buffer (i.e., the number of redundancy versions) is set to (n+m) where n and m are positive integers. In this case, a value of m may be determined based on the maximum size of the codeword where a decoding delay in the physical layer is reflected and the amount of resources for transmission.

Referring to FIG. 20, for example, redundancy versions 0 to (n−1) can be configured according to the same method as that used for the conventional LTE turbo code. A redundancy version n and higher correspond to data not processed by the physical layer. However, as the parity P2 is repeatedly transmitted, it is possible to have the same effect as obtained by applying as that obtained by applying a repetition code. Therefore, the parity P2 can be repeatedly transmitted to reduce decoding complexity or delay. In addition, when retransmission is performed, decoding can be performed more rapidly by transmitting the parity P2.

Figure 21A:
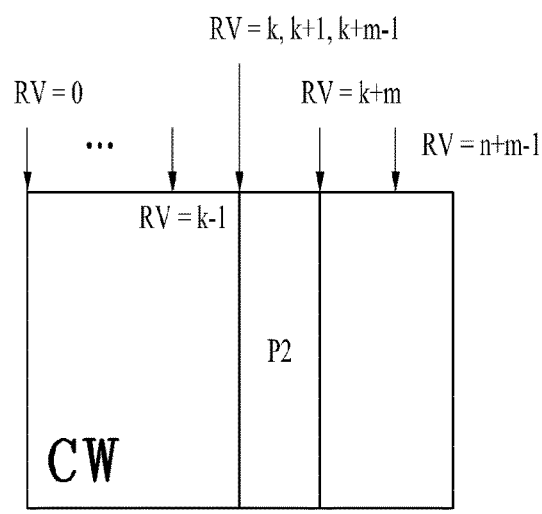
FIGS. 21a and 21b illustrate a configuration of a circular buffer according to another embodiment.
Figure 21B:
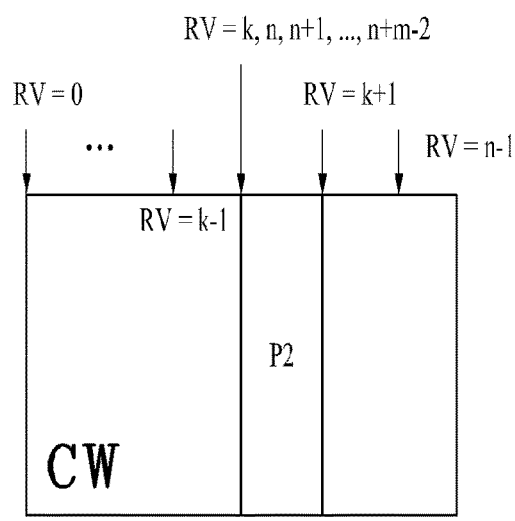

FIGS. 21a and 21b illustrate a configuration of a circular buffer according to another embodiment.

Since the embodiment of FIGS. 21a and 21b is similar to that of FIG. 20, the features already mentioned with reference to FIG. 20 will be omitted herein to avoid redundancy. Similar to FIG. 20, a parity P2 of FIG. 21 is the outer code parity where physical layer decoding is not applied. However, unlike the embodiment of the FIG. 20, the parity P2 is not located at the end portion of the circular buffer and the circular buffer may further include an inner code parity processed by the physical layer as well as the parity P2.

According to the embodiment of FIG. 21a, all redundancy versions k to (k+m−1) are located at a starting point of the parity P2. Thus, the parity P2 can be repeatedly transmitted up to m times. In other words, after codewords located at redundancy versions 0 to (k−1) are transmitted, the parity P2 is transmitted. In case of retransmission, a decoding failure may occur even if the parity P2 is repeatedly transmitted. In this case, a parity (i.e., inner code parity) generated in the physical layer at a location corresponding to a redundancy version (k+m) or higher can be transmitted.

According to the embodiment of FIG. 21b, an entire code block including the parity P2 is transmitted once. If the decoding failure occurs, the parity P2 can be repeatedly transmitted. In addition, after an inner code parity corresponding to a redundancy version included in the range from a redundancy version (k+1) to a redundancy version (n−1), which is processed by the physical layer, is transmitted, the parity P2 is repeatedly transmitted.

For instance, the embodiment of FIGS. 21a and 21b may correspond to the code block configuration of FIGS. 17a and 17b. According to the embodiment of FIGS. 17a and 17b, the inner code parity P' is generated based on at least one portion of the payload and one outer code parity. In this embodiment, since it is assumed that the inner code parity P' of FIGS. 17a and 17b is generated based on the first outer code parity P1 (cf. FIG. 16), the parity P2 can be located in the circular buffer without the decoding procedure in the physical layer. For example, the inner code parity P' may be located in a region after the parity P2 within the circular buffer.

As another example, the embodiment of FIGS. 21a and 21b may correspond to the codeword configuration of FIG. 18. According to the embodiment of FIG. 18, the inner code parity P' is generated based on the payload and one outer code parity. In this embodiment, it is assumed that the inner code parity P' of FIG. 18 is generated based on the first outer code parity P1 (cf. FIG. 16). Thus, when the codeword of FIG. 18 is located in the circular buffer, the parity P2 can be located in the circular buffer without the decoding procedure in the physical layer. For example, the inner code parity P' may be located in a region after the parity P2 within the circular buffer.

As a further example, the embodiment of FIGS. 21a and 21b may correspond to the codeword configuration of FIG. 19. According to this embodiment, the parity P2 may correspond to the outer code parity P2 of FIG. 18. Thus, when the code block of FIG. 19 is located in the circular buffer, the parity P2 can be located in the circular buffer without the decoding procedure in the physical layer. For example, the inner code parities P1' and P2' may be located in a region after the parity P2 within the circular buffer.

Figure 22:
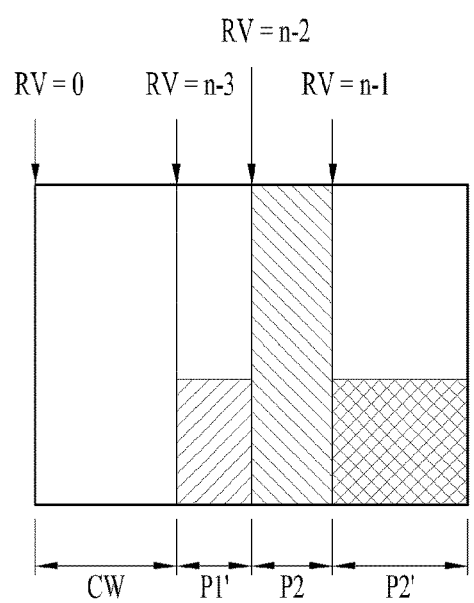
FIG. 22 illustrates a configuration of a circular buffer according to a further embodiment.

FIG. 22 illustrates a configuration of a circular buffer according to a further embodiment.

According to the embodiment of FIG. 22, the circular buffer can be mainly divided into four portions and have a total of n redundancy versions. In this case, a codeword (CW) corresponds to redundancy versions included in the range from a redundancy version 0 to a redundancy version (n−4). A parity P1' corresponds to a redundancy version (n−3). The parity P1' may be generated based on a first parity of the outer code and a payload of the outer code. A parity P2 corresponds to a redundancy version (n−2) and matches a second parity of the outer code. A parity P2' corresponds to a redundancy version (n−1) and it may be generated based on the first parity, second parity, and payload of the outer code.

The code configuration described above with reference to FIG. 19 can be applied to the embodiment of FIG. 22. Meanwhile, as a signal-to-noise ratio increases during retransmission, a payload error may be reduced. In this case, it is expected that decoding can be achieved using only the parity P1'. Therefore, a redundancy version for the retransmission may be selected in the range from the redundancy version 0 to the redundancy version (n−3).

Figure 23:
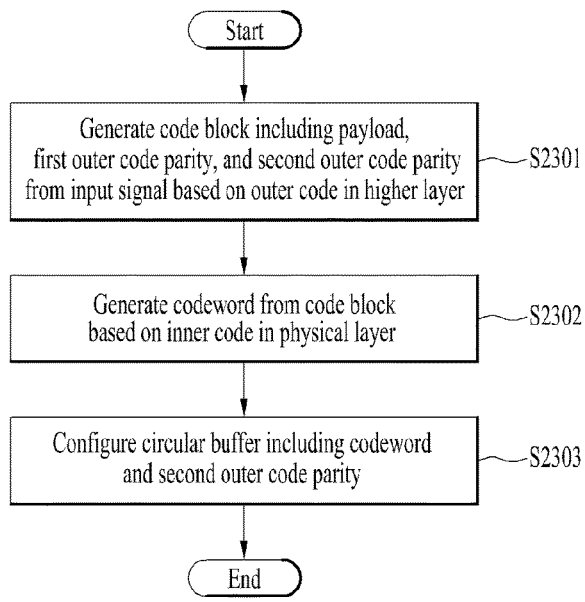
FIG. 23 is a flowchart for explaining a decoding method according to an embodiment of the present invention.

FIG. 23 is a flowchart for explaining a decoding method according to an embodiment of the present invention.

First, a transmitting end generates a code block including a payload, a first outer code parity, and a second outer code parity from an input signal based on an outer code in a higher layer [S2301]. In this case, a code block configuration is the same as that described above with reference to FIG. 16.

Next, the transmitting end may generate a codeword from a code block based on an inner code in a physical layer [S2302]. For example, the inner code may be the LDPC code. The codeword may include at least one inner code parity generated based on at least part of the code block. The codeword may include the payload and first outer code parity included in the code block, and a first inner code parity. In addition, the codeword may include the payload, the first outer code parity, and the second outer code parity included in the code block, and the first inner code parity. Moreover, the codeword may include the payload, the first outer code parity, and the second outer code parity included in the code block, the first inner code parity, and a second inner code parity. A codeword configuration is the same as that described above with reference to FIGS. 17a to 19.

In addition, the transmitting end may configure a circular buffer including the codeword and the second outer code parity [S2303]. At least one redundancy version may be configured for a starting point of the second outer code parity. A circular buffer configuration are the same as that described above with reference to FIGS. 20 to 22.

Although not shown in FIG. 23, the transmitting end may transmit the codeword stored in the circular buffer. If receiving NACK in response to the transmitted codeword, the transmitting end can retransmit data in the circular buffer corresponding to a predetermined redundancy version.

Figure 24:
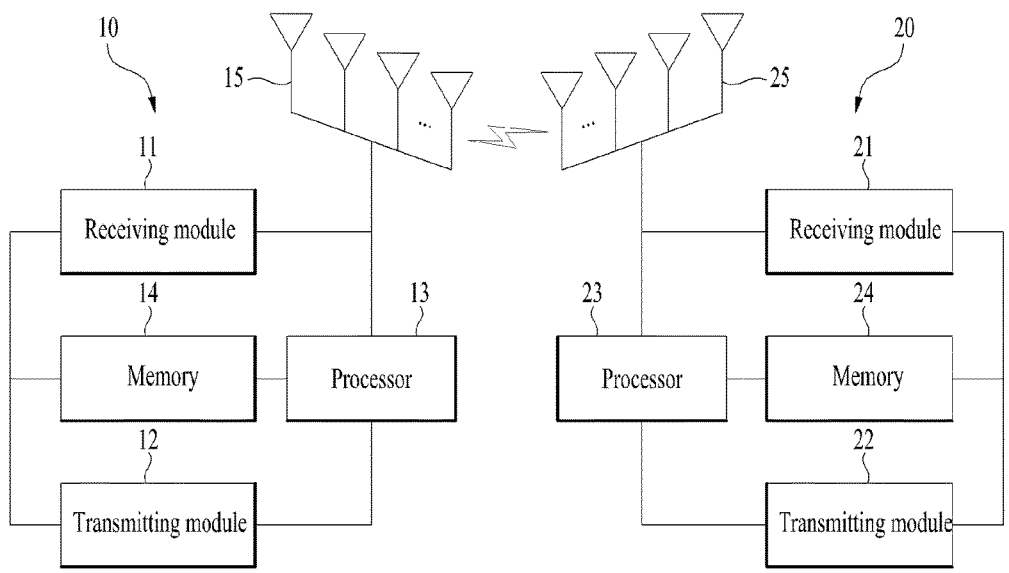
FIG. 24 is a block diagram illustrating configurations of a base station (BS) and a user equipment (UE) according to an embodiment of the present disclosure.

FIG. 24 is a schematic diagram for explanation of components of apparatuses to which the embodiments of the present invention of FIGS. 1 to 23 are applicable, according to an embodiment of the present invention.

Referring to FIG. 24, a BS apparatus 10 according to the present invention may include a receiving module 11, a transmitting module 12, a processor 13, a memory 14, and a plurality of antennas 15. The transmitting module 12 may transmit various signals, data, and information to an external apparatus (e.g., a UE). The receiving module 11 may receive various signals, data, and information from an external apparatus (e.g., a UE). The receiving module 11 and the transmitting module 12 may each be referred to as a transceiver. The processor 13 may control an overall operation of the BS apparatus 10. The antennas 15 may be configured according to, for example, 2-dimensional (2D) antenna arrangement.

The processor 13 of the BS apparatus 10 according to an embodiment of the present invention may be configured to receive channel state information according to proposed embodiments of the present invention. In addition, the processor 13 of the BS apparatus 10 may perform a function for calculating and processing information received by the BS apparatus 10 and information to be externally transmitted, and the memory 14 may store the calculated and processed information for a predetermined time period and may be replaced with a component such as a buffer (not shown) or the like.

Referring to FIG. 24, a UE apparatus 20 according to the present invention may include a receiving module 21, a transmitting module 22, a processor 23, a memory 24, and a plurality of antennas 25. The antennas 25 refer to a terminal apparatus for supporting MIMO transmission and reception. The transmitting module 22 may transmit various signals, data, and information to an external apparatus (e.g., an eNB). The receiving module 21 may receive various signals, data, and information from an external apparatus (e.g., an eNB). The receiving module 21 and the transmitting module 22 may each be referred to as a transceiver. The processor 23 may control an overall operation of the UE apparatus 20.

The processor 23 of the UE apparatus 20 according to an embodiment of the present invention may be configured to transmit channel state information according to proposed embodiments of the present invention. In addition, the processor 23 of the UE apparatus 20 may perform a function for calculating and processing information received by the UE apparatus 20 and information to be externally transmitted, and the memory 24 may store the calculated and processed information for a predetermined time period and may be replaced with a component such as a buffer (not shown) or the like.

The aforementioned components of the BS apparatus 10 and the UE apparatus 20 may be embodied by independently applying the above description of the present invention or simultaneously applying two or more embodiments of the present invention, and a repeated description is not given for clarity.

In addition, with regard to the various embodiments of the present invention, although an example in which a downlink transmission entity or an uplink reception entity is an eNB and a downlink reception entity or an uplink transmission entity is a UE has been described, the scope of the present invention is not limited thereto. For example, the above description of the eNB may be applied in the same way to the case in which a cell, an antenna port, an antenna port group, an RRH, a transmission point, a reception point, an access point, a relay, etc. are a downlink transmission entity to a UE or an uplink reception entity from the UE. In addition, the principle of the present invention that has been described with regard to the various embodiments of the present invention may also be applied in the same way to the case in which a relay is a downlink transmission entity to a UE or an uplink reception entity to a UE or the case in which a relay is an uplink transmission entity to an eNB or a downlink reception entity from an eNB.

The embodiments of the present disclosure may be achieved by various means, for example, hardware, firmware, software, or a combination thereof.

In a hardware configuration, an embodiment of the present disclosure may be achieved by one or more application specific integrated circuits (ASICs), digital signal processors (DSPs), digital signal processing devices (DSDPs), programmable logic devices (PLDs), field programmable gate arrays (FPGAs), processors, controllers, microcontrollers, microprocessors, etc.

In a firmware or software configuration, an embodiment of the present disclosure may be implemented in the form of a module, a procedure, a function, etc. Software code may be stored in a memory unit and executed by a processor. The memory unit is located at the interior or exterior of the processor and may transmit and receive data to and from the processor via various known means.

The embodiments of the present disclosure described above are combinations of elements and features of the present disclosure. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present disclosure or included as a new claim by a subsequent amendment after the application is filed.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

INDUSTRIAL APPLICABILITY

The embodiments of the present disclosure are applicable to various wireless access systems and broadcasting communication systems. Examples of the various wireless access systems include a 3rd generation partnership project (3GPP) system, a 3GPP2 system, and/or an institute of electrical and electronics engineers (IEEE) 802.xx system. The embodiments of the present disclosure may be applied to all technical fields in which the various wireless access systems find their applications, as well as the various wireless access systems.

What is claimed is:

1. A method for configuring a circular buffer in a wireless communication system, the method performed by a user equipment (UE) and comprising:
    generating a code block comprising a payload, a first outer code parity, and a second outer code parity from an input signal based on an outer code in a higher layer;
    generating a codeword from the code block based on an inner code in a physical layer; and
    configuring a circular buffer comprising the codeword and one or more second outer code parities,
    wherein the first outer code parity is generated based on a first portion of the payload,
    wherein the one or more second outer code parities, to which an encoding is not applied in the physical layer, are generated based on a second portion of the payload,
    wherein at least a part of the second portion is different from the first portion,
    wherein the codeword comprises the payload, the first outer code parity, and an inner code parity generated from at least a part of the code block based on the inner code, and
    wherein a number of the one or more second outer code parities in the circular buffer is determined according to a maximum size of the codeword or an amount of resources for transmission.

2. The method of claim 1, wherein the inner code is a low density parity check (LDPC) code.

3. The method of claim 1, wherein a plurality of redundancy versions are configured at a starting point of the one or more second outer code parities in the circular buffer.

4. The method of claim 1, wherein the inner code parity comprises:
    a first inner code parity generated based on the payload and the first outer code parity; and
    a second inner code parity generated based on the payload, the first outer code parity, and the one or more second outer code parities.

5. The method of claim 1, wherein the inner code parity is generated based on the payload and the first outer code parity.

6. The method of claim 1, further comprising:
    transmitting data from the configured circular buffer.

7. A user equipment (UE) in a wireless communication system, the UE comprising:
    a transceiver configured to transmit and receive signals; and
    a processor for controlling the transceiver, wherein the processor is configured to:
        generate a code block comprising a payload, a first outer code parity, and a second outer code parity from an input signal based on an outer code in a higher layer;
        generate a codeword from the code block based on an inner code in a physical layer; and
        configure a circular buffer comprising the codeword and one or more second outer code parities,
    wherein the first outer code parity is generated based on a first portion of the payload,
    wherein the one or more second outer code parities, to which an encoding is not applied in the physical layer, are generated based on a second portion of the payload,
    wherein at least a part of the second portion is different from the first portion,
    wherein the codeword comprises the payload, the first outer code parity, and an inner code parity generated from at least a part of the code block based on the inner code, and
    wherein a number of the one or more second outer code parities in the circular buffer is determined according to a maximum size of the codeword or an amount of resources for transmission.

8. The UE of claim 7, wherein the inner code is a low density parity check (LDPC) code.

9. The UE of claim 7, wherein a plurality of redundancy versions are configured at a starting point of the one or more second outer code parities in the circular buffer.

10. The UE of claim 7, wherein the inner code parity comprises:
    a first inner code parity generated based on the payload and the first outer code parity; and
    a second inner code parity generated based on the payload, the first outer code parity, and the one or more second outer code parities.

11. The UE of claim 7, wherein the inner code parity is generated based on the payload and the first outer code parity.

12. The UE of claim 7, wherein the processor is configured to control the transceiver to transmit data from the configured circular buffer.

* * * * *